United States Patent
Lin

(10) Patent No.: US 8,184,831 B2
(45) Date of Patent: May 22, 2012

(54) AUDIO PLAYING SYSTEMS

(75) Inventor: Wei-Cheng Lin, Taipei County (TW)

(73) Assignee: Princeton Technology Corporation, Taipei County (TW)

( * ) Notice: Subject to any disclaimer, the term of this patent is extended or adjusted under 35 U.S.C. 154(b) by 1031 days.

(21) Appl. No.: 12/018,246

(22) Filed: Jan. 23, 2008

(65) Prior Publication Data

US 2008/0253584 A1 Oct. 16, 2008

(30) Foreign Application Priority Data

Dec. 4, 2007 (TW) .............................. 96220561 U

(51) Int. Cl.
 *H02B 1/00* (2006.01)
 *H03F 99/00* (2009.01)
 *H03K 17/00* (2006.01)
(52) U.S. Cl. ..................... 381/123; 381/120; 327/416
(58) Field of Classification Search .................. 381/120, 381/123; 327/416
See application file for complete search history.

(56) References Cited

U.S. PATENT DOCUMENTS

| 2002/0186853 | A1* | 12/2002 | Anderson | 381/98 |
| 2003/0058040 | A1* | 3/2003 | Miyagaki et al. | 330/10 |
| 2003/0095666 | A1* | 5/2003 | Ramage | 381/2 |
| 2006/0159292 | A1* | 7/2006 | Guilbert | 381/120 |

* cited by examiner

*Primary Examiner* — Kiesha Bryant
*Assistant Examiner* — Dmitriy Yemelyanov
(74) *Attorney, Agent, or Firm* — Thomas|Kayden

(57) ABSTRACT

An audio playing system is provided comprising a first processing module, a second processing module, a control module, an output module, and a displaying module. The first and second processing modules amplify an audio signal and respectively generates a first first processed signal, a first second processed signal, a second first processed signal, and a second second processed signal. The control module is coupled to the first processing module and the second processing module and generates a playing signal according to a control signal, the first first processed signal, the first second processed signal, the second first processed signal, and the second second processed signal. The output module is coupled to the control module and amplifies the playing signal to generate an output signal. The displaying module is coupled to the output module and plays the output signal.

12 Claims, 2 Drawing Sheets

AUDIO PLAYING SYSTEMS

BACKGROUND OF THE INVENTION

1. Field of the Invention

The invention relates to an audio playing system, and more particularly to an audio playing system preventing electromagnetic interference (EMI).

2. Description of the Related Art

Currently, audio signal amplifiers are implemented mainly by Class D amplifiers. A Class AB amplifier, a formerly implemented amplifier, generates a linear signal, and a Class D amplifier generates a pulse-width modulation (PWM) signal which comprises audio frequency signals, a PWM switch signal, and PWM harmonic waves. When a Class D amplifier operates, the metal-oxide semiconductor field-effect transistor (MOSFET) impedance during an output stage switches to low from high, and the MOSFET operates in the active region for a few seconds. Thus, power consumption for an output stage of a Class D amplifier is much lower than that of a Class AB amplifier. Moreover, an inductor plus capacitor (LC) filter within the Class D amplifier saves enough power during each operating period of the Class D amplifier, so that power consumption when the Class D amplifier is turned on or off does not occur in speakers connected to the Class D amplifier.

However, electromagnetic interference (EMI) is a problem for a Class D amplifier. Because operations, such as turning on and off transistors, are continuously performed in a Class D amplifier, EMI may occur more easily. When a Class D amplifier is used to drive an earphone, connection lines of the earphone exacerbate EMI. Thus, improving the problem of EMI for a Class D amplifier and enhancing quality of audio played by an audio signal amplifier are important issues.

BRIEF SUMMARY OF THE INVENTION

An exemplary embodiment of an audio playing system comprises a first processing module, a second processing module, a control module, an output module, and a playing module. The first processing module amplifies an audio signal and generates a first first processed signal and a first second processed signal respectively at a first first output terminal and a first second output terminal. The second processing module amplifies the audio signal and generates a second first processed signal and a second second processed signal respectively at a second first output terminal and a second second output terminal. The control module is coupled to the first processing module and the second processing module and generates a playing signal according to a control signal, the first first processed signal, the first second processed signal, the second first processed signal, the second second processed signal. The output module is coupled to the control module and amplifies the playing signal to generate an output signal. The playing module is coupled to the output module and plays the output signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
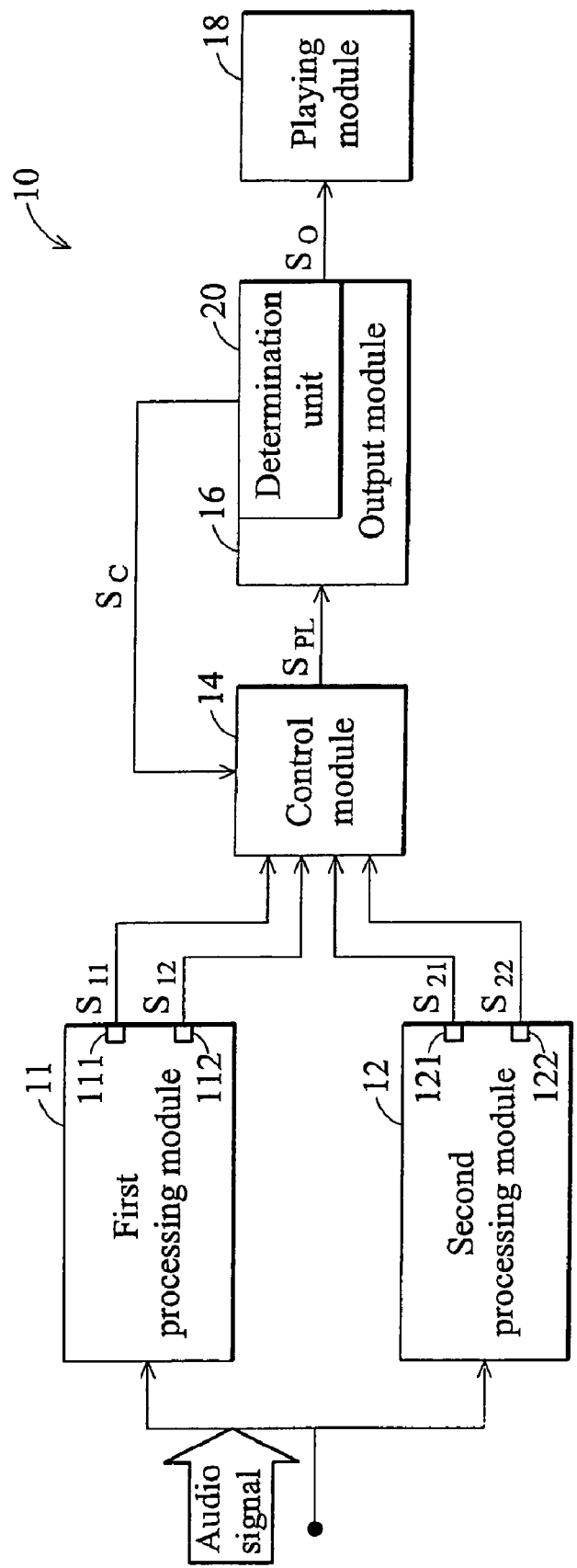
FIG. 1 shows an exemplary embodiment of an audio playing system.

Audio playing systems are provided. In an exemplary embodiment of an audio playing system shown in FIG. 1, an audio playing system 10 comprises a first processing module 11, a second processing module 12, a control module 14, an output module 16, and a playing module 18. The first processing module 11 amplifies an audio signal and generates a first first processed signal $S_{11}$ and a first second processed signal $S_{12}$ respectively at a first first output terminal 111 and a first second output terminal 112. The second processing module 12 amplifies the audio signal and generates a second first processed signal $S_{21}$ and a second second processed signal $S_{22}$ respectively at a second first output terminal 121 and a second second output terminal 122. The control module 14 is coupled to the first processing module 11 and the second processing module 12 and generates a playing signal $S_{PL}$ according to a control signal $S_C$, the first first processed signal $S_{11}$, the first second processed signal $S_{12}$, the second first processed signal $S_{21}$, and the second second processed signal $S_{22}$. The output module 16 is coupled to the control module 14 and amplifies the playing signal $S_{PL}$ to generate an output signal $S_O$. The playing module 18 is coupled to the output module 15 and plays the output signal $S_O$. In some embodiments, the first processing module 11 is a pre-driver of a Class D audio signal amplifier, and the second processing module 12 is a pre-driver of a Class AB audio signal amplifier. The playing module 18 can be a speaker or an earphone. In the embodiment, the phase difference between the first first processed signal $S_{11}$ and the first second processed signal $S_{12}$ is 180 degrees, and the phase difference between the second first processed signal $S_{21}$ and the second second processed signal $S2_2$ is 180 degrees.

Additionally, the output module 16 of the audio playing system 10 comprises a determination unit 20 coupled to the control module 14 and the playing module 18. The determination unit 20 determines whether the playing module 18 is an earphone and generates the control signal $S_C$ according to the determined result. In some embodiments, the determination unit 20 comprises an output pin (not shown in FIG. 1) which is used to couple to an input terminal of the earphone. The determination unit 20 determines whether the playing module 18 is an earphone according to whether the output pin couples to the input terminal of the earphone or not. If the playing module 18 is an earphone, the control signal $S_C$ is generated. When the determination unit 20 determines that the playing module 18 is an earphone, the control module 14 is controlled by the generated control signal $S_C$ to generate the playing signal $S_{PL}$ according to the second first processed signal $S_{21}$ and the second second processed signal $S_{22}$. When the determination unit 20 determines that the playing module 18 is not an earphone, the control module 14 generates the playing signal $S_{PL}$ according to the first first processed signal $S_{11}$ and the first second processed signal $S_{12}$. The circuit of the determination unit 20 can be composed of a resistor coupled to a ground. When the input terminal of an earphone is coupled to the output pin, a current is generated. Thus, it is known that an earphone is inserted into the output pin, and the playing module 18 is determined as an earphone. Thus, completing an example for the operation of the determination unit 20. Any circuit for determining whether two devices are coupled to each other can be implemented as the determination unit 20. Thus, the determination unit 20 is not limited to above example.

Figure 2:
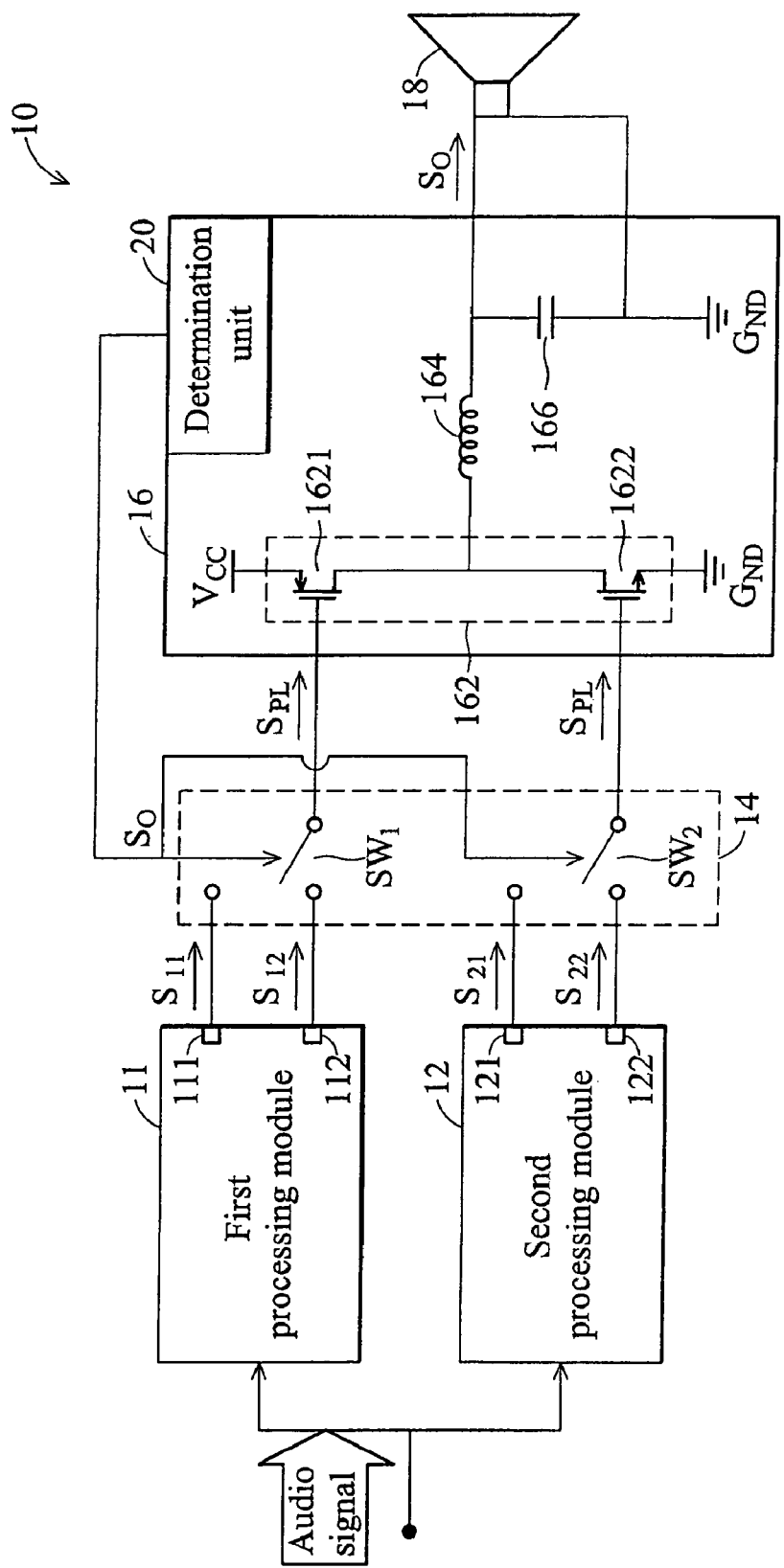
FIG. 2 shows another exemplary embodiment of an audio playing system.

FIG. 2 is another exemplary embodiment of an audio playing system. In the embodiment of FIG. 2, for example, the playing module 18 is a speaker. The control module 14 comprises a first switch $SW_1$ and a second switch $SW_2$. One terminal of the first switch $SW_1$ is coupled to the output module 16, and the other terminal thereof is selectively coupled to the first first output terminal 111 of the first processing module 11 or the second first output terminal 121 of the second processing module 12 according to the control signal $S_C$. One terminal of the second switch $SW_2$ is coupled to the output module 16, and the other terminal thereof is selectively coupled to the first second output terminal 112 of the first processing module 11 or the second second output terminal 122 of the second processing module 12 according to the control signal $S_C$.

The output module 16 comprises a transistor set 162, an inductance 164, and a capacitor 166. A first input terminal of the transistor set 162 is coupled to the first switch $SW_1$, a second input terminal thereof is coupled to the second switch $SW_2$. A first terminal of the inductance 164 is coupled to an output terminal of the transistor set 162. A first terminal of the capacitor 166 is coupled to a second terminal of the inductance 164, and a second terminal thereof is coupled to a ground GND. The transistor set 162 amplifies the playing signal $S_{PL}$. The inductance 164 and the capacitor 166 work together to filter the amplified play signal $S_{PL}$ to generate the output signal $S_O$.

The transistor set 162 comprises a first transistor 1621 and a second transistor 1622. A gate of the first transistor 1621 is coupled to the first input terminal of the transistor set 162, a source thereof is coupled to a voltage source $V_{CC}$, and a drain thereof is coupled to the output terminal of the transistor set 162. A gate of the second transistor 1622 is coupled to the second input terminal of the transistor set 162, a source thereof is coupled to the ground GND, and a drain thereof is coupled to the output terminal of the transistor set 162.

According to the embodiment of the invention, the audio playing system comprises both, a Class D audio signal amplifier and a Class AB audio signal amplifier. When the load is determined to be a speaker, the audio playing system processes the audio signal using the Class D audio signal amplifier and plays the processed signal through the speaker. When the load is determined to be an earphone, the audio playing system is switched to use the Class AB audio signal amplifier for processing and plays the processed signal through the earphone. Thus, serious EMI caused by using a Class D audio signal amplifier to drive an earphone can be prevented, so that quality and audio signal playing effect can be enhanced. For the invention, with the exception of the inductor and the capacitor of the output module and the playing module, other elements of the invention can be disposed within an integrated circuit, thus reducing size of the entire circuit.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An audio playing system, comprising
a first processing module amplifying an audio signal and generating a first first processed signal and a first second processed signal respectively at a first first output terminal and a first second output terminal;
a second processing module amplifying the audio signal and generating a second first processed signal and a second second processed signal respectively at a second first output terminal and a second second output terminal;
a control module coupled to the first processing module and the second processing module and generating a playing signal according to a control signal, the first first processed signal, the first second processed signal, the second first processed signal, and the second second processed signal;
an output module coupled to the control module to receive the playing signal and amplifying the playing signal to generate an output signal; and
a playing module coupled to the output module and playing the output signal;
wherein the control module is coupled between the first and second processing modules and the output module, and the output module is coupled between the control module and the playing module.

2. The audio playing system as claimed in claim 1, wherein the playing module is a speaker or an earphone.

3. The audio playing system as claimed in claim 2, wherein the output module comprises a determination unit coupled to the control module and the playing module, and the determination unit determines whether the playing module is an earphone and generates the control signal according to the determined result.

4. The audio playing system as claimed in claim 3, wherein the determination unit comprises an output pin for coupling to an input terminal of the earphone, and the determination unit determines whether the output pin couples to the input terminal of the earphone and generates the control signal if the output pin couples to the input terminal of the earphone.

5. The audio playing system as claimed in claim 3:
wherein when the determination unit determines that the playing module is the earphone, the control module is controlled by the generated control signal to generate the playing signal according to the second first processed signal and the second second processed signal; and
wherein when the determination unit determines that the playing module is not the earphone, the control module generates the playing signal according to the first first processed signal and the first second processed signal.

6. The audio playing system as claimed in claim 1, wherein the first processing module is a pre-driver of a Class D audio signal amplifier.

7. The audio playing system as claimed in claim 1, wherein the second processing module is a pre-driver of a Class AB audio signal amplifier.

8. The audio playing system as claimed in claim 1, wherein the control module comprises:
a first switch comprising one terminal coupled to the output module and the other terminal selectively coupled to the first first output terminal of the first processing module or the second first output terminal of the second processing module according to the control signal; and
a second switch comprising one terminal coupled to the output module and the other terminal selectively coupled to the first second output terminal of the first processing module or the second second output terminal of the second processing module according to the control signal.

9. The audio playing system as claimed in claim 8, wherein the output module comprises:
 a transistor set comprising a first input terminal coupled to the first switch and a second input terminal coupled to the second switch and amplifying the playing signal;
 an inductance comprising a first terminal coupled to an output terminal of the transistor set; and
 a capacitor comprising a first terminal coupled to a second terminal of the inductance and a second terminal coupled to a ground GND.

10. The audio playing system as claimed in claim 9, wherein the transistor set comprises:
 a first transistor comprising a gate coupled to the first input terminal of the transistor set, a source coupled to a voltage source, and a drain coupled to the output terminal of the transistor set; and
 a second transistor comprising a gate coupled to the second input terminal of the transistor set, a source coupled to the ground, and a drain coupled to the output terminal of the transistor set.

11. The audio playing system as claimed in claim 1, wherein a phase difference between the first first processed signal and the first second processed signal is 180 degrees.

12. The audio playing system as claimed in claim 1, wherein a phase difference between the second first processed signal and the second second processed signal is 180 degrees.

* * * * *